(12) United States Patent
Hasebe et al.

(10) Patent No.: US 7,520,937 B2
(45) Date of Patent: Apr. 21, 2009

(54) THIN FILM FORMING APPARATUS AND METHOD OF CLEANING THE SAME

(75) Inventors: Kazuhide Hasebe, Tokyo-To (JP);
Mitsuhiro Okada, Tokyo-To (JP);
Hiromichi Kotsugai, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 268 days.

(21) Appl. No.: 10/927,415

(22) Filed: Aug. 26, 2004

(65) Prior Publication Data
US 2005/0066993 A1 Mar. 31, 2005

(30) Foreign Application Priority Data
Aug. 29, 2003 (JP) ............... 2003-305722

(51) Int. Cl.
*B08B 3/12* (2006.01)
*B08B 6/00* (2006.01)

(52) U.S. Cl. ............... 134/1; 134/8; 134/22.1; 118/715; 438/905

(58) Field of Classification Search .......... 134/8, 134/22.1; 438/905
See application file for complete search history.

(56) References Cited

U.S. PATENT DOCUMENTS

| | | | |
|---|---|---|---|
| 4,749,440 A * | 6/1988 | Blackwood et al. ......... | 438/706 |
| 5,264,396 A * | 11/1993 | Thakur et al. .............. | 438/695 |
| 5,350,480 A * | 9/1994 | Gray ..................... | 156/345.26 |
| 5,449,411 A * | 9/1995 | Fukuda et al. ........ | 118/723 MP |
| 5,620,526 A * | 4/1997 | Watatani et al. ............. | 134/1.1 |
| 5,804,259 A * | 9/1998 | Robles ...................... | 427/577 |
| 6,029,680 A * | 2/2000 | Hawthorne et al. .......... | 134/1.3 |
| 6,164,295 A * | 12/2000 | Ui et al. ....................... | 134/1.1 |
| 6,383,300 B1 | 5/2002 | Saito et al. | |
| 6,566,271 B1 * | 5/2003 | Gschwandtner et al. ..... | 438/706 |
| 6,843,858 B2 * | 1/2005 | Rossman ..................... | 134/30 |

(Continued)

FOREIGN PATENT DOCUMENTS

JP 03-293726 12/1991

(Continued)

OTHER PUBLICATIONS

Japanese Office Action issued Aug. 26, 2008 for corresponding Japanese Application No. 2003-305722.

(Continued)

*Primary Examiner*—Allan Olsen
(74) *Attorney, Agent, or Firm*—Smith, Gambrell & Russell, LLP (57) ABSTRACT

The present invention relates to a technique for cleaning a thin film forming apparatus. In a typical embodiment, deposits originating from process gases for forming a thin film and deposited on the inner surface of a reaction tube are removed by etching by supplying a cleaning gas into the reaction tube while heating the interior of the reaction tube at a predetermined temperature. The inner surface of the reaction tube roughened by etching is subjected to a planarizing step. The planarizing step is performed by supplying a gas containing hydrogen fluoride into the reaction tube while keeping the interior of the reaction tube 2 at a low temperature, such as a room temperature. The planarizing step is effective in preventing the reduction of deposition rate in a thin film forming process.

4 Claims, 4 Drawing Sheets

U.S. PATENT DOCUMENTS

| | | | |
|---|---|---|---|
| 6,905,800 B1 * | 6/2005 | Yuen et al. | 430/5 |
| 6,909,156 B2 * | 6/2005 | Aoyama | 257/410 |
| RE38,760 E * | 7/2005 | Grant et al. | 438/723 |
| 2002/0062845 A1 | 5/2002 | Kawai et al. | |
| 2004/0182423 A1 * | 9/2004 | Nakao | 134/22.1 |
| 2004/0231695 A1 * | 11/2004 | Ohno et al. | 134/1 |
| 2004/0251235 A1 * | 12/2004 | Shinriki et al. | 216/58 |
| 2005/0070104 A1 * | 3/2005 | O'Meara et al. | 438/689 |
| 2005/0188923 A1 * | 9/2005 | Cook et al. | 118/728 |
| 2005/0211264 A1 * | 9/2005 | Kostenko et al. | 134/1.1 |
| 2005/0227378 A1 * | 10/2005 | Moise et al. | 438/3 |
| 2005/0245099 A1 * | 11/2005 | Endo et al. | 438/785 |
| 2006/0017043 A1 * | 1/2006 | Wu et al. | 252/372 |
| 2006/0040508 A1 * | 2/2006 | Ji et al. | 438/758 |
| 2006/0081182 A1 * | 4/2006 | Okada et al. | 118/715 |
| 2006/0213539 A1 * | 9/2006 | Hasebe et al. | 134/22.1 |

FOREIGN PATENT DOCUMENTS

| | | |
|---|---|---|
| JP | 2002-164335 A | 6/2002 |
| KR | 2000-0035733 | 6/2000 |

OTHER PUBLICATIONS

Korean Office Action issued Apr. 22, 2008 for Korean Application No. 10-2004-0067670.

* cited by examiner

THIN FILM FORMING APPARATUS AND METHOD OF CLEANING THE SAME

BACKGROUND OF THE INVENTION

1. Field of the Invention

The present invention relates to a thin film forming apparatus and a method of cleaning the same. More specifically, the present invention relates to techniques for removing deposits deposited on the surfaces of component members of a thin film forming apparatus during a process for forming a thin film on an object to be processed, such as a semiconductor wafer.

2. Description of the Related Art

Thin films, such as a silicon dioxide film and a silicon nitride film, are formed on an object to be processed, such as a semiconductor wafer, by the following CVD (Chemical Vapor Deposition) process to fabricate semiconductor devices.

A wafer boat holding a plurality of semiconductor wafers is loaded into a reaction tube of a thermal processing apparatus heated at a predetermined loading temperature by a heater. Then, the interior of the reaction tube is heated at a predetermined process temperature by a heater, and gases in the reaction tube are discharged through the exhaust port thereof for evacuation to reduce pressure in the reaction tube to a predetermined pressure. After the interior of the reaction tube has been stabilized at a predetermined temperature and a predetermined pressure, film forming gases are supplied through a process gas supply pipe into the reaction tube. The film forming gases undergo thermal reaction in the reaction tube, and a reaction product deposits on surfaces of the semiconductor wafers to form thin films on the surfaces of the semiconductor wafers.

The reaction product produced during thin film formation deposits not only on the surfaces of the semiconductor wafers but also on the inner surface of the reaction tube and surfaces of members exposed to an atmosphere in the reaction tube, such as jigs placed in the reaction tube. The amount of the deposited reaction product increases and, eventually, the deposited reaction product comes off the surfaces and produces particles. Particles that adhere to the semiconductor wafers reduce the yield of semiconductor devices fabricated on the semiconductor wafers.

To prevent such a problem, a cleaning gas, such as a mixed gas of fluorine and a halogen-containing acid gas, is supplied into the reaction tube heated at a predetermined temperature by the heater to remove the reaction products deposited on the inner surface of the reaction tube by dry etching (See JP 3-293726 A, for example.).

The dry etching of the reaction product with the cleaning gas supplied into the reaction tube damages a material forming the reaction tube, such as quartz, and many minute cracks are formed in the surface of the reaction tube. Such minute cracks roughen the inner surface of the reaction tube. Consequently, the surface area of the inner surface of the reaction tube increases, which causes a reduction in the deposition rate.

The reaction product can be removed and the surface area of the reaction tube can be decreased (i.e., planarization) by cleaning the wall surface of the reaction tube by wet cleaning (wet etching) using a hydrofluoric (HF) acid solution. However, wet etching requires troublesome manual cleaning, and disassembling, reassembling and adjusting the thermal processing apparatus. Consequently, the thermal processing apparatus is kept inoperative for a long time, in other words, a long downtime of the processing apparatus occurs, resulting in reduction in the rate of operation of the thermal processing apparatus.

SUMMARY OF THE INVENTION

The present invention has been made in view of the foregoing problems and it is therefore an object of the present invention to provide a cleaning method capable of removing deposits originating from film forming gases and deposited on the component members of a thermal processing apparatus without increasing the surface areas of the component members.

Another object of the present invention is to carry out the cleaning method without disassembling the thermal processing apparatus.

Another object of the present invention is to provide a thermal processing apparatus capable of carrying out the cleaning method.

In order to achieve the objectives, according to the first aspect of the present invention, there is provided a method of cleaning a member, exposed to an atmosphere in a reaction chamber of a thin film forming apparatus, on which deposits originating from a process gas are deposited when the reaction chamber is supplied with the process gas to form a thin film on an object to be processed. The method includes: a deposit removing step that supplies a cleaning gas into the reaction chamber heated at a predetermined temperature to activate the cleaning gas, thereby to remove the deposits from a surface of the member with the activated cleaning gas; and a planarizing step that keeps the reaction chamber at a predetermined temperature after the deposit removing step and supplies a gas containing hydrogen fluoride into the reaction chamber, thereby to planarize the surface of the member.

Preferably, the planarizing step keeps the reaction chamber at a temperature between 0° C. and 200° C., such as a room temperature.

Preferably, the members to be cleaned are formed of quartz.

Preferably, the cleaning gas is a mixed gas containing fluorine gas and hydrogen fluoride gas.

The thin film to be formed on the object is a silicon nitride film, a silicon dioxide film or a polysilicon film, for example. The deposit removing step removes silicon nitride, silicon dioxide or polysilicon deposited on the surface of the members during the formation of the thin film on the object with the cleaning gas.

According to the second aspect of the present invention, there is provided a thin film forming apparatus that forms a thin film on an object to be processed placed in a reaction chamber by supplying a process gas into the reaction chamber, and removes deposits originating from the process gas and deposited on the surfaces of a member exposed to an atmosphere in the reaction chamber. The apparatus includes: a heater for heating the reaction chamber at a predetermined temperature; a cleaning gas supply system for supplying a cleaning gas into the reaction chamber; a planarizing gas supply system for supplying a planarizing gas containing hydrogen fluoride into the reaction chamber; and a control unit configured to control the cleaning gas supply system to supply the cleaning gas into the reaction chamber while controlling the heater to heat the reaction chamber at a predetermined temperature in order to activate the cleaning gas and remove the deposits from the member by the activated cleaning gas, and thereafter to control the planarizing gas supply system to supply the planarizing gas into the reaction chamber while controlling the heater to heat the reaction chamber at a predetermined temperature.

Preferably, the control unit controls the heater to keep the reaction chamber at a temperature in the range of 0° C. to 200° C., such as a room temperature, and controls the planarizing gas supply system to supply the planarizing gas into the reaction chamber heated at the predetermined temperature.

Preferably, the members to be exposed to the planarizing gas are formed of quartz.

Preferably, the cleaning gas supply system supplies a cleaning gas containing fluorine gas and hydrogen fluoride gas into the reaction chamber.

The thin film to be formed on the object is a silicon nitride film, a silicon dioxide film or a polysilicon film, for example.

DESCRIPTION OF THE PREFERRED EMBODIMENTS

Figure 1:
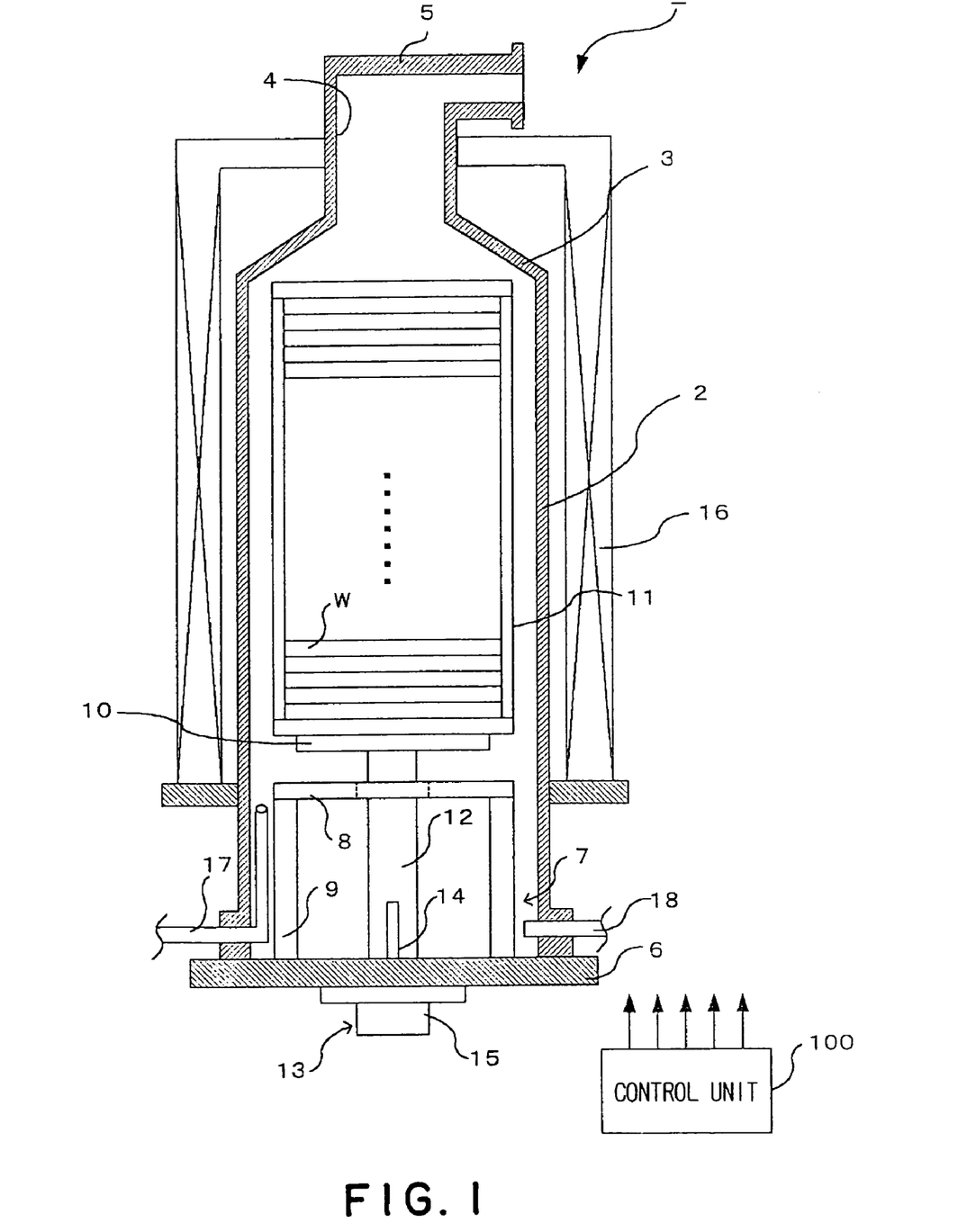
FIG. 1 is a schematic sectional view of a thin film forming apparatus in a preferred embodiment according to the present invention.

A thin film forming apparatus and a method of cleaning the same according to the present invention will be described on an assumption that the thin film forming apparatus is a batch type vertical thermal processing apparatus 1 as shown in FIG. 1.

Referring to FIG. 1, the thermal processing apparatus 1 has a substantially cylindrical, vertical reaction tube 2. The reaction tube 2 is formed of a material excellent in heat resistance and corrosion resistance, such as quartz.

The reaction tube 2 has a substantially conical top part 3 tapering upward. The top part 3 is provided in its central portion with a gas outlet 4 through which gases are discharged from the reaction tube 2. A discharge pipe 5 is connected in an airtight fashion to the gas outlet 4. The discharge pipe 5 is provided with a pressure regulating mechanism, not shown, including a valve and a vacuum pump to keep the interior of the reaction tube 2 at a desired pressure (a vacuum).

A lid 6 is disposed below the reaction tube 2. The lid 6 is formed of a material excellent in heat resistance and corrosion resistance, such as quartz. The lid 6 can be vertically moved by a boat elevator, not shown. The boat elevator raises the lid 6 to close the opened lower end of the reaction tube 2 and lowers the lid 6 to open the opened lower end of the reaction tube 2.

A heat insulating tube 7 is mounted on the lid 6. The heat insulating tube 7 prevents the drop of temperature in the reaction tube 2 due to heat dissipation through the opened lower end of the reaction tube 2. The heat insulating tube 7 includes, as principal components, a flat heater 8 provided with a resistance heating element, and a cylindrical support 9 supporting the heater 8 at a predetermined height from the upper surface of the lid 6.

A turntable 10 is disposed above the heat insulating tube 7. The turntable 10 is able to rotate with a wafer boat 11 holding objects to be processed, such as semiconductor wafers W, supported thereon. A rotary column 12 connected to the turntable 10 extends downward through a central portion of the heater 8 and is connected to a rotating mechanism 13 for rotating the turntable 10. The rotating mechanism 13 includes, as principal components, a motor (not shown), and a rotary feedthrough 15 having a rotary shaft 14. The rotary shaft 14 penetrates the lid 6 and the gap between the rotary shaft 14 and the lid 6 is sealed. The rotary shaft 14 is connected to the rotary column 12. The torque of the motor is transmitted through the rotary column 12 to the turntable 10. The rotation of the rotary shaft 14 rotated by the motor of the rotating mechanism 13 is transmitted to the rotary column 12 to rotate the turntable 10.

The wafer boat 11 is capable of holding a plurality of semiconductor wafers W, such as 100 semiconductor wafers W, at predetermined vertical intervals. The wafer boat 11 may be formed of quartz. As the wafer boat 11 is mounted on the turntable 10, the wafer boat 11 rotates together with the turntable 10 and the semiconductor wafers W held on the wafer boat 11 rotate.

A heater 16 for heating the reaction tube 2 is arranged so as to surround the reaction tube 2. The heater 16 may be composed of resistance heating elements. The heater 16 heats the interior of the reaction tube 2 at a predetermined temperature to heat the semiconductor wafers W at a predetermined temperature.

Process gas supply pipes 17 penetrate the side wall of the reaction tube 2 near the lower end of the reaction tube 2 to supply process gases, such as film forming gases, a cleaning gas and a planarizing gas, into the reaction tube 2. Each process gas supply pipe 17 is connected through mass flow controllers, not shown, to a process gas source, not shown. Although only one process gas supply pipe 17 is shown in FIG. 1 for simplicity of the drawing, plural process gas supply pipes 17, the number of which correspond to the number of the types of the process gases to be supplied to the reaction tube 2, may be provided. In a typical embodiment, a film forming gas supply pipe for carrying a film forming gas into the reaction tube 2, a cleaning gas supply pipe for carrying a cleaning gas into the reaction tube 2 and a planarizing gas supply pipe for carrying a planarizing gas into the reaction tube 2 penetrate the side wall of the reaction tube 2 near the lower end of the reaction tube 2.

A purge gas supply pipe 18 also penetrates the side wall of the reaction tube 2 near the lower end of the reaction tube 2. The purge gas supply pipe 18 is connected through a mass flow controller, not shown, to a purge gas source, not shown, to supply a purge gas at a predetermined flow rate into the reaction tube 2.

Functional components, including the pressure regulating mechanism placed in the discharge pipe 5, the boat elevator, the heater 8, the motor of the rotating mechanism 13, the reaction tube heater 16, the mass flow controllers placed in the process gas supply pipe 17 and the purge gas supply pipe 18, are connected to a control unit 100. The control unit 100 includes a microprocessor, a process controller and such. Sensors measure temperatures and pressures in parts of the thermal processing apparatus 1. The control unit 100 gives the functional components control signals on the basis of measured data provided by the sensors to control the thermal processing apparatus 1 for operations according to recipes (time sequences) shown in FIGS. 2 and 3.

A cleaning method to be performed by the thermal processing apparatus 1 having the aforementioned structure will be described. The description will be made with reference to the recipe shown in FIG. 3 as applied to a case where silicon nitride is deposited on members exposed to an atmosphere in the reaction tube 2 during a film forming process for forming silicon nitride films on semiconductor wafers W. Although the following description will not mention the control unit 100, the operations of the functional components of the thermal processing apparatus 1 are controlled by the control unit 100.

Figure 2:
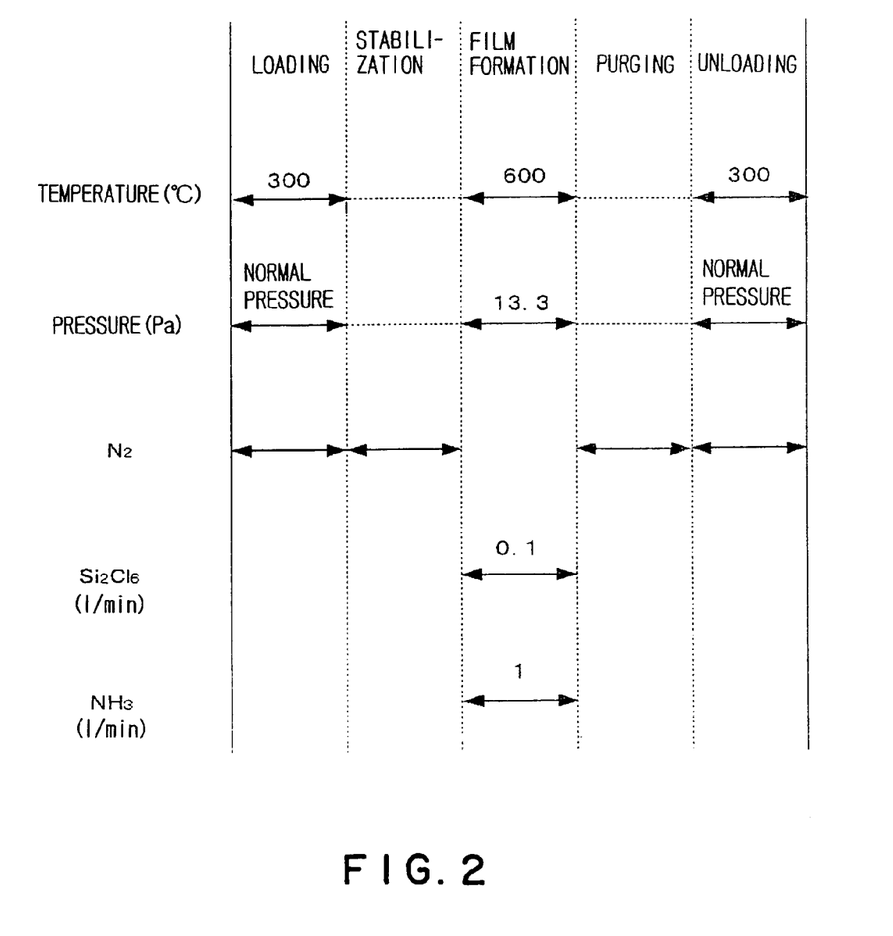
FIG. 2 is a diagram showing a recipe specifying a film forming process to be performed by the thin film forming apparatus.

A film forming process will be described in connection with the recipe shown in FIG. 2 prior to the description of a cleaning process. The heater 16 heats the interior of the reaction tube 2 at a predetermined loading temperature. A predetermined amount of nitrogen gas ($N_2$) is supplied through the purge gas supply pipe 18 into the reaction tube 2. Subsequently, the wafer boat 11 holding the semiconductor wafers W is mounted on the lid 6, and the lid 6 is raised by the boat elevator, not shown, to load the wafer boat 11 into the reaction tube 2. Thus, the reaction tube 2 is loaded with the semiconductor wafers W and is sealed (Loading step).

Then, a predetermined amount of nitrogen gas is supplied through the purge gas supply pipe 18 into the reaction tube 2, the interior of the reaction tube 2 is heated at a predetermined film forming temperature (processing temperature) of, for example, 600° C. by the heater 16. Then, the reaction tube 2 is evacuated to a predetermined reduced pressure of, for example, 13.3 Pa (0.1 torr). Those pressure reducing and heating operations are continued until the pressure and the temperature in the reaction tube 2 are stabilized at the predetermined pressure and the predetermined temperature (Stabilizing step). The motor of the rotating mechanism 13 is controlled to rotate the turntable 10 supporting the wafer boat 11 thereon. Thus, the semiconductor wafers W held by the wafer boat 11 rotate, and are thus heated uniformly.

After the interior of the reaction tube 2 has been stabilized at the predetermined pressure and the predetermined temperature, the supply of nitrogen gas through the purge gas supply pipe 18 is stopped. Then, as the process gas, hexachlorodisilane ($Si_2Cl_6$) and ammonia ($NH_3$) are supplied through the process gas supply pipes 17 at predetermined flow rates of, for example, 0.1 l/min and 1 l/min, respectively, into the reaction tube 2. Hexachlorodisilane and ammonia supplied into the reaction tube 2 are heated in the reaction tube 2 and undergo a thermal decomposition reaction. Consequently, silicon nitride films ($Si_3N_4$ films) are deposited on surfaces of the semiconductor wafers W (Film forming step).

After the silicon nitride films of a predetermined thickness have been formed on the surfaces of the semiconductor wafers W, the supply of hexachlorodisilane and ammonia through the process gas supply pipes 17 is stopped. Subsequently, gases are discharged from the reaction tube 2 and a predetermined amount of nitrogen gas is supplied into the reaction tube 2 to purge the gases remaining in the reaction tube 2 through the discharge pipe 5 (Purging step). It is preferable to perform a cycle purge operation, which repeats a discharge operation for discharging gases from the reaction tube 2 and a purging operation for supplying nitrogen gas into the reaction tube 2 alternately several cycles, to purge the reaction tube 2 completely of the gases.

Then, the interior of the reaction tube 2 is heated at a predetermined temperature of, for example 300° C. by the reaction tube heater 16, a predetermined amount of nitrogen gas is supplied through the purge gas supply pipe 18 into the reaction tube 2 to set the interior of the reaction tube 2 at a normal pressure. Then, the boat elevator, not shown, lowers the lid 6 to unload the wafer boat 11 (Unloading step).

As the film forming process is repeated several times, silicon nitride produced by the film forming process deposits not only on the surfaces of the semiconductor wafers W but also on the inner surface of the reaction tube and the surfaces of members exposed to the atmosphere in the reaction tube 2, such as the wafer boat 11. The thermal processing apparatus 1 is cleaned by the cleaning process to remove silicon nitride undesirably deposited on those surfaces after completion of several cycles of the film forming process. The cleaning process will be described in connection with the recipe shown in FIG. 3. Although the inner surface of the reaction tube 2 is supposed to be an object of the cleaning process by way of example in the following description to simplify the description, it is to be understood that the surfaces of other members placed in the reaction tube 2, such as the wafer boat 11, are cleaned by the same cleaning process.

Figure 3:
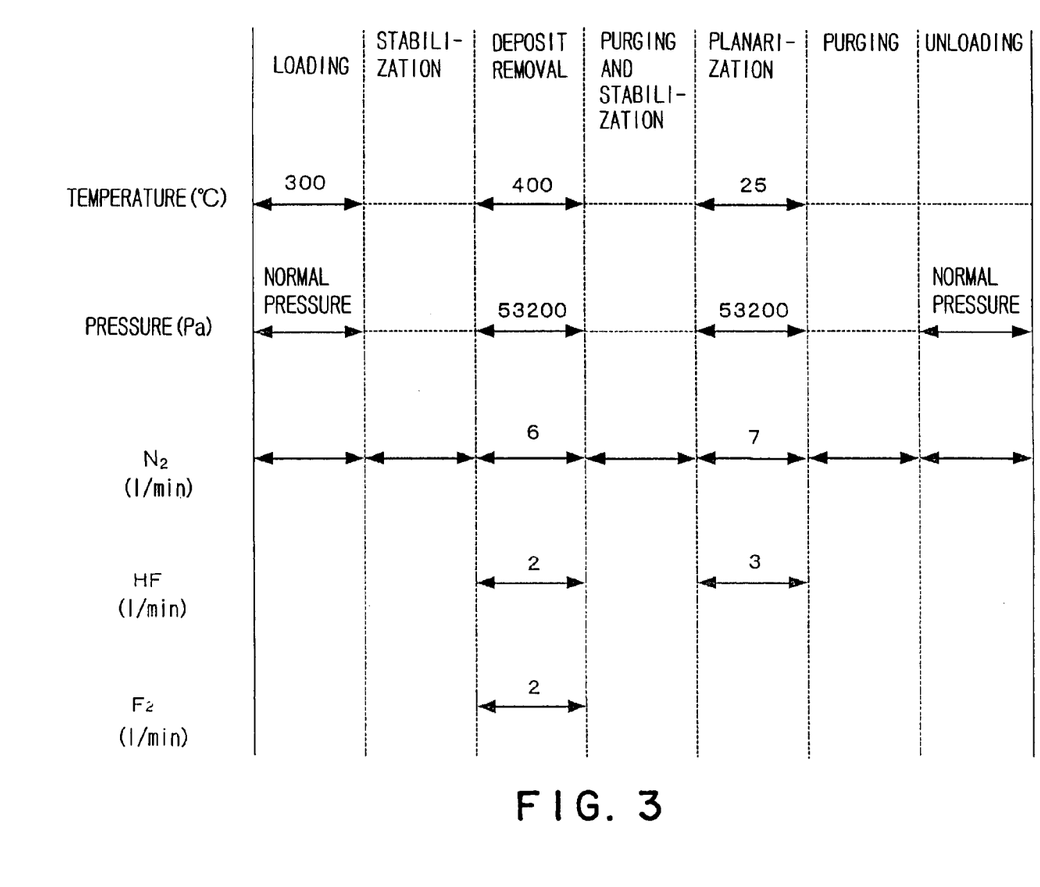
FIG. 3 is a diagram showing a recipe specifying a cleaning process to be performed by the thin film forming apparatus.

The heater 16 heats the reaction tube 2 to maintain the interior of the reaction tube 2 at the loading temperature of, for example, 300° C. After a predetermined amount of nitrogen gas is supplied through the purge gas supply pipe 18 into the reaction tube 2, an empty wafer boat 11 not holding any semiconductor wafers W is mounted on the lid 6, the lid 6 is elevated by the boat elevator, not shown, to load the wafer boat 11 into the reaction tube 2 (Loading step).

Subsequently, a predetermined amount of nitrogen gas is supplied through the purge gas supply pipe 18 into the reaction tube 2, and the reaction tube heater 16 heats the interior of the reaction tube 2 at a predetermined cleaning temperature of, for example, 400° C. The reaction tube 2 is evacuated to reduce the pressure in the reaction tube 2 to a predetermined pressure of, for example, 53,200 Pa (400 torr). Those pressure reducing and heating operations are continued until the pressure and the temperature in the reaction tube 2 are stabilized at the predetermined pressure and the predetermined temperature (Stabilizing step).

After the interior of the reaction tube 2 has been stabilized at the predetermined pressure and the predetermined temperature, a cleaning gas is supplied through the process gas supply pipes 17 into the reaction tube 2. In this embodiment, as the cleaning gas, hydrogen fluoride gas (HF gas), is supplied at a predetermined flow rate, for example 2 l/min, and fluorine gas ($F_2$ gas) is supplied at a predetermined flow rate of, for example, 2 l/min, into the reaction tube 2; and as a diluent gas, nitrogen gas is supplied at a predetermined flow rate of, for example, 6 l/min, into the reaction tube 2. The cleaning gas is heated in the reaction tube 2 to be in a condition in which fluorine contained in the cleaning gas is activated, in other words, the cleaning gas contains many reactive free atoms. The activated fluorine acts on silicon nitride deposited on the inner surface of the reaction tube 2 to remove the deposited silicon nitride from the inner surface of the reaction tube 2 by etching (Removing step).

After the deposited silicon nitride has been removed, the supply of the cleaning gas through the process gas supply pipes 17 is stopped, the gases are discharged from the reaction tube 2, and a predetermined amount of nitrogen gas is supplied through the purge gas supply pipe 18 into the reaction tube 2 to purge gases from the reaction tube 2 through the discharge pipe 5. The heater 16 sets the interior of the reaction tube 2 at a predetermined temperature of, for example, 25° C. (room temperature). The interior of the reaction tube 2 is maintained at a predetermined pressure of, for example, 53,200 Pa (400 torr). These operations are continued until the pressure and the temperature in the reaction tube 2 are stabilized at the predetermined pressure and the predetermined temperature (Purging and stabilizing step).

After the interior of the reaction tube 2 has been stabilized at the predetermined pressure and the predetermined temperature, a planarizing gas is supplied through the process gas supply pipes 17 into the reaction tube 2. In this embodiment, as the planarizing gas, hydrogen fluoride (HF) gas is supplied at a predetermined flow rate of, for example, 3 l/min, and nitrogen gas is supplied at a predetermined flow rate of, for example, 7 l/min, into the reaction tube 2. Since the interior of the reaction tube 2 is at the room temperature (25° C.), fluorine contained in the planarizing gas etches the inner surface of the reaction tube 2 at a low etch rate and etches selectively ridges of microscopic irregularities formed in the inner surface of the reaction tube 2 in the removing step (see Section (c) in FIG. 4) to planarize the inner surface of the reaction tube 2 (Planarizing step).

Preferably, the temperature in the reaction tube 2 is in the range of 0° C. to 200° C. It is difficult to activate the planarizing gas (fluorine) and to perform effective etching at temperatures below 0° C. Cracks formed in the reaction tube 2 in the removing step are liable to be selectively etched and it is possible that the surface area of the inner surface of the reaction tube increases at temperatures above 200° C.

If hydrogen fluoride is supplied into the reaction tube while the interior of the reaction tube 2 is at a low temperature, the materials placed in the reaction tube 2 are liable to be corroded by interaction between hydrogen fluoride and a small amount of moisture inevitably contained in the atmosphere in the reaction tube 2. Therefore, the member, such as the lid 6, exposed to the planarizing gas will become corroded if the member is formed of a stainless steel. Since the reaction tube 2 and the lid 6 of this embodiment are formed of quartz, i.e., a material excellent in heat resistance and corrosion resistance, such a problem does not arise in this thin film forming apparatus.

After the completion of the planarizing step, the supply of hydrogen fluoride gas and nitrogen gas through the process gas supply pipes 17 is stopped. Then, the gases are discharged from the reaction tube 2 and a predetermined amount of nitrogen gas is supplied through the purge gas supply pipe 18 into the reaction tube 2 to discharge the gases remaining in the reaction tube 2 through the discharge pipe 5 (Purging step).

A predetermined amount of nitrogen gas is supplied through the purge gas supply pipe 18 into the reaction tube 2 so as to set the interior of the reaction tube 2 at a normal pressure. Then, the lid 6 is lowered by the boat elevator, for unloading (Unloading step).

After the cleaning process has been thus completed, the lid 6 is lowered by the boat elevator to take out the wafer boat 11 from the reaction tube 2, the wafer boat 11 is loaded with semiconductor wafers W, the wafer boat 11 holding the semiconductor wafers W is mounted on the lid 6 again to start the film forming process for forming silicon nitride films on the semiconductor wafers W subsequently to the cleaning process. Since the inner surface of the reaction tube 2 is planarized by the planarizing step, the reduction of deposition rate in the film forming process can be suppressed.

Figure 4:
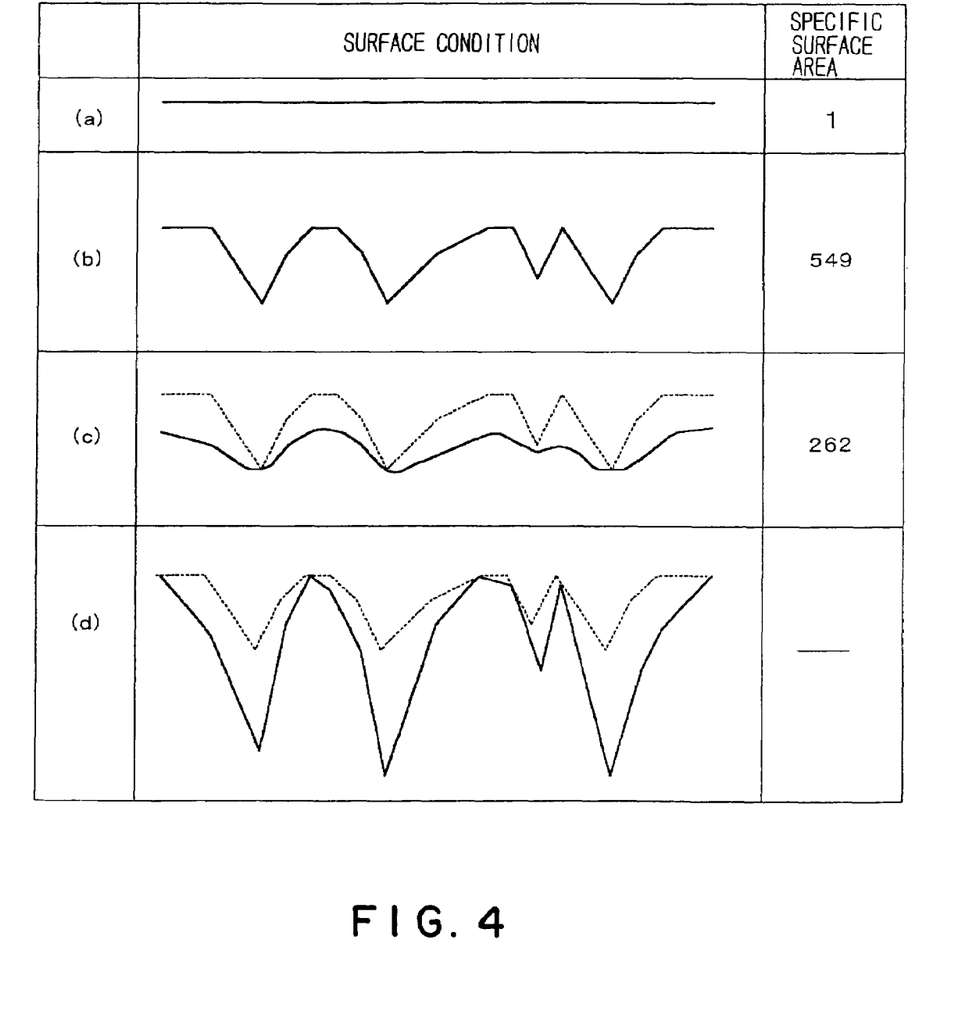
FIG. 4 is a diagram showing the condition and specific surface area of the inner surface of a wall of a reaction tube.

Results of test conducted to confirm the effect of the planarizing step will be described. A 1.5 μm thick silicon nitride film was deposited on the inner surface of the reaction tube 2 by a film forming process specified by a recipe shown in FIG. 2, and then the inner surface of the reaction tube 2 was cleaned by the cleaning process specified by the recipe shown in FIG. 3. Then, the condition and the specific surface area of the inner surface of the reaction tube 2 were measured. FIG. 4 shows the condition and the specific surface area of the inner surface of the reaction tube 2. Diagrams shown in FIG. 4 represent typical microscopic photographs of irregularities in the inner surface of the reaction tube 2. Specific surface area is the ratio of the surface area of the used reaction tube 2 to that of the new reaction tube 2 shown in Section (a) of FIG. 4. Specific surface area was calculated by the BET (Brunauer-Emmett-Teller) method. Section (b) of FIG. 4 shows the condition and the specific surface area of the inner surface of the reaction tube 2 after the removing step. Section (c) of FIG. 4 shows the condition and the specific surface area of the inner surface of the reaction tube 2 after the planarizing step. Section (a) of FIG. 4 shows the condition and the specific surface area of the inner surface of the new reaction tube 2 before being used for the film forming process, and Section (d) of FIG. 4 shows the condition and the specific surface area of the inner surface of the reaction tube 2 after being processed by the planarizing step at 300° C., for comparison. The morphology of the inner surface of the reaction tube 2 after the removing step indicated by full lines in Section (b) of FIG. 4 is indicated by broken lines in Sections (c) and (d) of FIG. 4 for reference.

As obvious from Sections (b) and (c) of FIG. 4, the inner surface of the reaction tube 2 was planarized and the specific surface area could be reduced by half by performing the planarizing step under proper conditions after the removing step. The entire inner surface of the reaction tube 2 was planarized by etching as shown in Section (c) of FIG. 4 when the planarizing step was performed by setting the interior of the reaction tube 2 at 25° C. Cracks formed by the removing step are selectively etched and irregularities in the inner surface of the reaction tube 2 were enhanced as shown in Section (d) of FIG. 4 when the planarizing step was performed by setting the interior of the reaction tube at 300° c.

The present invention is not limited in its practical application to the foregoing embodiment specifically described herein and various changes and modifications are possible.

In the forgoing embodiment, the deposit to be cleaned is silicon nitride, but is not limited thereto, and may be silicon dioxide, polysilicon, titanium oxide, tantalum oxide, silica, silicon-germanium (SiGe), BSTO ($BaSrTiO_3$) and STO ($SrTiO_3$). The deposit is not limited to the reaction product and may be a reaction by-product, such as ammonium chloride.

Although the foregoing embodiment uses the mixed gas containing hydrogen fluoride gas and nitrogen gas as the planarizing gas, any suitable planarizing gas may be used provided that the planarizing gas contains hydrogen fluoride. The planarizing gas does not necessarily need to contain nitrogen gas as a diluent gas. However, it is preferable to use a planarizing gas containing a diluent gas because such a planarizing gas facilitates etch rate control and process time management. Preferably, the diluent gas is an inert gas. The diluent gas may be an inert gas other than nitrogen gas, such as helium gas (He), neon gas (Ne) or argon gas (Ar).

Although the foregoing embodiment uses the mixed cleaning gas containing fluorine gas, hydrogen fluoride gas and nitrogen gas, any suitable cleaning gas, such as fluorine gas, hydrogen fluoride gas, chlorine trifluoride gas or a mixture of some of those gases, may be used.

Although the foregoing embodiment sets the interior of the reaction tube 2 at 53,200 Pa (400 torr) for the cleaning process, the pressure in the reaction tube 2 does not need to be necessarily limited thereto. The cleaning process may be performed once every several cycles of the film forming process, or every one cycle of the film forming process.

The reaction tube 2 and the lid 6 may be formed of a stainless steel instead of quartz. However, it is preferable to form the members to be exposed to the planarizing gas are formed of a highly corrosion-resistant material, such as quartz because the corrosion of those members by the planarizing gas is possible.

Although the thermal processing apparatus 1 in the foregoing embodiment is provided with the process gas supply pipes 17 respectively for the different process gases (i.e., the film forming gas, the cleaning gas and the planarizing gas), the thermal processing apparatus 1 may be provided with process gas supply pipes 17, the number of which (in this case, five) corresponds to the number of the types of the component gases of the process gas (i.e., fluorine gas, hydrogen fluoride gas, hexachlorodisilane gas, ammonia gas and nitrogen gas). A plurality of process gas supply pipes 17 may be used for supplying one type of a gas. In this case, those process gas supply pipes 17 are arranged to penetrate different portions of the side wall of the reaction tube 2 near the lower end of the reaction tube 2 in order to distribute the process gas more uniformly in the reaction tube 2.

Although the thermal processing apparatus in the foregoing embodiment is the batch type thermal processing apparatus provided with the reaction tube of single-tube construction, the present invention is not limited thereto. For example, a thermal processing apparatus may be such as a batch type vertical thermal processing apparatus of double-tube construction provided with a reaction tube 2 consisting of outer and inner tubes or may be a single-wafer thermal processing apparatus. The objects to be processed are not limited to semiconductor wafers and may be, for example, glass substrates for LCDs.

The invention claimed is:

1. A method of cleaning a quartz member, exposed to an atmosphere in a reaction chamber of a thin film forming apparatus, on which silicon nitride deposits, said method comprising:

a deposit removing step that supplies a cleaning gas containing hydrogen fluoride gas and fluorine gas into the reaction chamber heated at a first predetermined temperature, the first predetermined temperature being such as to activate the cleaning gas, thereby to remove the deposits from a surface of the member with the activated cleaning gas; and a planarizing step carried out after the deposit removing step such that the member surface from which the deposits have been removed is subjected to the planarizing step, the planarizing step being carried out at a second predetermined temperature and comprising supplying a planarizing gas containing hydrogen fluoride gas into the reaction chamber, thereby to planarize said surface of the member.

2. The method of cleaning a quartz member according to claim 1, wherein the first predetermined temperature is 400° C.

3. The method of cleaning a quartz member according to claim 1, wherein the planarizing step keeps the reaction chamber at a second predetermined temperature in a range of 0° C. to 200° C., the second predetermined temperature being lower than the first predetermined temperature.

4. The method of cleaning a quartz member according to claim 3, wherein the planarizing step keeps the reaction chamber at a room temperature.

* * * * *